United States Patent
Liang

(10) Patent No.: US 10,381,801 B1
(45) Date of Patent: Aug. 13, 2019

(54) DEVICE INCLUDING STRUCTURE OVER AIRGAP

(71) Applicant: Hewlett Packard Enterprise Development LP, Houston, TX (US)

(72) Inventor: Di Liang, Santa Barbara, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/963,543

(22) Filed: Apr. 26, 2018

(51) Int. Cl.
| | |
|---|---|
| *H01S 5/00* | (2006.01) |
| *H01S 5/183* | (2006.01) |
| *H01S 5/30* | (2006.01) |
| *H01S 5/22* | (2006.01) |
| *H01S 5/20* | (2006.01) |
| *H01S 5/223* | (2006.01) |
| *H01S 5/323* | (2006.01) |
| *H01S 5/02* | (2006.01) |
| *H01S 5/10* | (2006.01) |
| *H01S 5/32* | (2006.01) |

(52) U.S. Cl.
CPC ...... *H01S 5/18316* (2013.01); *H01S 5/18363* (2013.01); *H01S 5/18369* (2013.01); *H01S 5/18377* (2013.01); *H01S 5/2045* (2013.01); *H01S 5/22* (2013.01); *H01S 5/223* (2013.01); *H01S 5/2206* (2013.01); *H01S 5/3013* (2013.01); *H01S 5/0206* (2013.01); *H01S 5/105* (2013.01); *H01S 5/32* (2013.01); *H01S 5/323* (2013.01)

(58) Field of Classification Search
CPC ........ H01S 5/22; H01S 5/3013; H01S 5/2206; H01S 5/18369; H01S 5/18316; H01S 5/18363; H01S 5/20145; H01S 5/0206; H01S 5/233; H01S 5/105; H01S 5/323; H01S 5/32

See application file for complete search history.

(56) References Cited

U.S. PATENT DOCUMENTS

| | | |
|---|---|---|
| 4,408,330 A | 10/1983 | An |
| 5,294,808 A | 3/1994 | Lo |

(Continued)

FOREIGN PATENT DOCUMENTS

| | | |
|---|---|---|
| CN | 1476132 A | 2/2004 |
| CN | 101467083 A | 6/2009 |

(Continued)

OTHER PUBLICATIONS

Gosh, S., et al; "Experimental and Theoretical Investigation of Thermal Stress Relief During Epitaxial Growth of Ge on Si Using Air-gapped Sio2 Nanotemplates", Oct. 2011; 9 pages.

(Continued)

*Primary Examiner* — Kinam Park
(74) *Attorney, Agent, or Firm* — Hewlett Packard Enterprise Patent Department

(57) ABSTRACT

A device comprises a substrate, a sacrificial material layer over the substrate, a first solid-state material layer over the sacrificial layer, a dielectric layer over solid-state material layer, and a second solid-state material layer over the dielectric layer. The sacrificial material layer may have an airgap, the solid-state material layer may comprise a structure over the airgap and may be separated from a bulk portion of the first material layer by trenches, where the trenches extend to the airgap.

20 Claims, 3 Drawing Sheets

(56) References Cited

U.S. PATENT DOCUMENTS

| | | |
|---|---|---|
| 5,512,375 A | 4/1996 | Green et al. |
| 5,764,670 A | 6/1998 | Ouchi |
| 5,883,009 A | 3/1999 | Villa et al. |
| 5,981,400 A | 11/1999 | Lo |
| 6,288,426 B1 | 9/2001 | Gauthier et al. |
| 6,437,372 B1 | 8/2002 | Geva et al. |
| 6,475,873 B1 | 11/2002 | Kalnitsky et al. |
| 6,492,283 B2 | 12/2002 | Raaijmakers et al. |
| 6,493,476 B2 | 12/2002 | Bendett |
| 6,515,333 B1 | 2/2003 | Riccobene |
| 6,526,083 B1 | 2/2003 | Kneissl et al. |
| 6,585,424 B2 | 7/2003 | Chason et al. |
| 6,705,681 B2 | 3/2004 | Russ |
| 6,706,581 B1 | 3/2004 | Hou et al. |
| 6,849,866 B2 | 2/2005 | Taylor |
| 6,902,987 B1 | 6/2005 | Tong et al. |
| 7,087,452 B2 | 8/2006 | Joshi et al. |
| 7,217,584 B2 | 5/2007 | Yue et al. |
| 7,231,123 B2 | 6/2007 | Sugita et al. |
| 7,368,816 B2 | 5/2008 | Lim et al. |
| 7,560,361 B2 | 7/2009 | Frank et al. |
| 7,579,263 B2 | 8/2009 | Han et al. |
| 7,639,719 B2 | 12/2009 | Fang et al. |
| 7,817,881 B2 | 10/2010 | Li |
| 7,838,314 B2 | 11/2010 | Choi et al. |
| 7,869,473 B2 | 1/2011 | Ye et al. |
| 7,935,559 B1 | 5/2011 | Giffard et al. |
| 7,949,210 B2 | 5/2011 | Durfee et al. |
| 8,078,018 B2 | 12/2011 | Mouli |
| 8,106,468 B2 | 1/2012 | Wang et al. |
| 8,344,453 B2 * | 1/2013 | Muller .............. H01L 21/02532 257/347 |
| 8,372,673 B2 | 2/2013 | Lee et al. |
| 8,488,917 B2 | 7/2013 | Manipatruni et al. |
| 8,502,279 B2 | 8/2013 | Toh et al. |
| 8,538,206 B1 | 9/2013 | Fish et al. |
| 8,664,087 B2 | 3/2014 | Chang et al. |
| 8,716,852 B2 | 5/2014 | Shu et al. |
| 8,937,981 B2 | 1/2015 | Liang |
| 9,018,675 B2 | 4/2015 | Bedell et al. |
| 9,059,252 B1 | 6/2015 | Liu et al. |
| 9,093,428 B2 | 7/2015 | Liang |
| 9,110,314 B2 | 8/2015 | Tu et al. |
| 9,240,406 B2 | 1/2016 | Feng et al. |
| 9,269,724 B2 | 2/2016 | Han |
| 9,509,122 B1 | 11/2016 | Norberg et al. |
| 9,570,351 B2 | 2/2017 | Liang |
| 9,640,531 B1 | 5/2017 | Dr-Bach et al. |
| 9,773,906 B2 * | 9/2017 | Wang .................. H01L 29/7848 |
| 2002/0081793 A1 | 6/2002 | Yang et al. |
| 2002/0094661 A1 | 7/2002 | Enquist et al. |
| 2002/0113288 A1 | 8/2002 | Clevenger et al. |
| 2002/0121337 A1 | 9/2002 | Whatmore et al. |
| 2002/0168837 A1 | 11/2002 | Hsu et al. |
| 2003/0006407 A1 | 1/2003 | Taylor |
| 2003/0025976 A1 | 2/2003 | Wipiejewski |
| 2003/0081642 A1 | 5/2003 | Hwang et al. |
| 2003/0134446 A1 | 7/2003 | Koike et al. |
| 2003/0203550 A1 | 10/2003 | Lai et al. |
| 2004/0028092 A1 | 2/2004 | Kim |
| 2004/0081386 A1 | 4/2004 | Morse et al. |
| 2004/0152272 A1 | 8/2004 | Fladre et al. |
| 2004/0184502 A1 | 9/2004 | Miyachi et al. |
| 2004/0248334 A1 * | 12/2004 | Hoss .................. H01L 33/005 438/39 |
| 2004/0257171 A1 | 12/2004 | Park et al. |
| 2004/0264530 A1 | 12/2004 | Ryou et al. |
| 2005/0081958 A1 | 4/2005 | Adachi et al. |
| 2005/0106790 A1 | 5/2005 | Cheng et al. |
| 2005/0139857 A1 | 6/2005 | Shin |
| 2005/0207704 A1 | 9/2005 | Keyser et al. |
| 2006/0035450 A1 | 2/2006 | Frank et al. |
| 2006/0063679 A1 | 3/2006 | Yue et al. |
| 2006/0181542 A1 | 8/2006 | Granger |
| 2007/0275505 A1 | 11/2007 | Wolterink et al. |
| 2008/0012145 A1 | 1/2008 | Jang |
| 2008/0018983 A1 | 1/2008 | Ishii et al. |
| 2008/0175294 A1 | 7/2008 | Kim et al. |
| 2008/0283877 A1 | 11/2008 | Collonge et al. |
| 2009/0080488 A1 | 3/2009 | Hatakeyama et al. |
| 2009/0101997 A1 | 4/2009 | Lammel et al. |
| 2009/0110342 A1 | 4/2009 | Webster et al. |
| 2009/0168821 A1 | 7/2009 | Fang et al. |
| 2009/0194152 A1 | 8/2009 | Liu et al. |
| 2009/0200636 A1 | 8/2009 | Edelstein et al. |
| 2009/0242935 A1 | 10/2009 | Fitzgerald |
| 2009/0263076 A1 | 10/2009 | Mathai et al. |
| 2009/0302415 A1 | 12/2009 | Mueller et al. |
| 2010/0060970 A1 | 3/2010 | Chen |
| 2010/0098372 A1 | 4/2010 | Manipatruni et al. |
| 2010/0119231 A1 | 5/2010 | Kim et al. |
| 2010/0140629 A1 | 6/2010 | Lee et al. |
| 2010/0140739 A1 | 6/2010 | Kim |
| 2010/0215309 A1 | 8/2010 | Shubin et al. |
| 2010/0295083 A1 | 11/2010 | Celler |
| 2011/0045644 A1 | 2/2011 | Barth et al. |
| 2011/0064099 A1 | 3/2011 | Govorkov et al. |
| 2011/0073989 A1 | 3/2011 | Rong et al. |
| 2011/0176762 A1 | 7/2011 | Fujikata et al. |
| 2011/0180795 A1 | 7/2011 | Lo et al. |
| 2011/0211786 A1 | 9/2011 | Ushida et al. |
| 2011/0293216 A1 | 12/2011 | Lipson et al. |
| 2012/0002285 A1 | 1/2012 | Matsuda |
| 2012/0008658 A1 | 1/2012 | Chung |
| 2012/0119258 A1 | 5/2012 | Liang |
| 2012/0189239 A1 | 7/2012 | Tu et al. |
| 2012/0257850 A1 | 10/2012 | Fujikata et al. |
| 2013/0009182 A1 | 1/2013 | Jung et al. |
| 2013/0009321 A1 | 1/2013 | Kagawa et al. |
| 2013/0029449 A1 | 1/2013 | Cheng et al. |
| 2013/0049203 A1 | 2/2013 | Ahrens et al. |
| 2013/0063226 A1 | 3/2013 | Burak et al. |
| 2013/0147021 A1 | 6/2013 | Puurunen et al. |
| 2013/0155484 A1 | 6/2013 | Sweatlock et al. |
| 2013/0168776 A1 | 7/2013 | Liang et al. |
| 2014/0141546 A1 | 5/2014 | Cho |
| 2014/0177994 A1 | 6/2014 | Chen |
| 2014/0264723 A1 * | 9/2014 | Liang ..................... H01L 27/12 257/507 |
| 2014/0307997 A1 | 10/2014 | Bar et al. |
| 2015/0055910 A1 | 2/2015 | Liang |
| 2015/0069418 A1 | 3/2015 | Heo et al. |
| 2015/0140720 A1 | 5/2015 | Collins |
| 2015/0144928 A1 | 5/2015 | Forrest et al. |
| 2015/0177458 A1 | 6/2015 | Bowers et al. |
| 2015/0179447 A1 | 6/2015 | Ryou et al. |
| 2015/0212266 A1 * | 7/2015 | Czornomaz ........ G02B 6/12004 385/14 |
| 2016/0094014 A1 | 3/2016 | Shin et al. |
| 2016/0126381 A1 | 5/2016 | Wang et al. |
| 2016/0238860 A1 | 8/2016 | Liang et al. |
| 2017/0077325 A1 | 3/2017 | Norberg et al. |
| 2017/0146740 A1 | 5/2017 | Orcutt et al. |
| 2017/0358607 A1 | 12/2017 | Balakrishnan et al. |

FOREIGN PATENT DOCUMENTS

| | | |
|---|---|---|
| CN | 100514099 C | 7/2009 |
| CN | 102314057 B | 5/2014 |
| EP | 2146243 A1 | 1/2010 |
| JP | 2005-093742 A | 4/2005 |
| JP | 2010-278396 A | 12/2010 |
| WO | 20131066318 A1 | 5/2013 |
| WO | 20131165376 A1 | 11/2013 |
| WO | 20141021781 A1 | 2/2014 |
| WO | 20141209398 A1 | 12/2014 |
| WO | 20161018285 A1 | 2/2016 |
| WO | 20161122547 A1 | 8/2016 |

OTHER PUBLICATIONS

Gosh, S., et al; "Investigations on Thermal Stress Relief Mechanism Using Air-gapped Sio2 Nanotemplates During Epitaxial Growth of

(56) References Cited

OTHER PUBLICATIONS

Ge on Si and Corresponding Hole Mobility Improvement": Apr. 2012; 4 pages.
Y. Tang et al., Optics Express, Mar. 28, 2011, vol. 9, No. 7, pp. 5811-5816.
Xiaonan Chen et al., "Active Transmission Control Based on Photonic-Crystal MOS Capacitor," Photonic Crystal Materials and Devices VI, Jan. 23, 2007, Proc. Of SPIE vol. 6480 pp. 1-9.
Sysak, M. N. et al., "Hybrid Silicon Laser Technology: A Thermal Perspective," Selceted Topics in Quantum Electronics, IEEE Journal of 17.6, 2011, pp. 1490-1498, available at http://optoelectronics.ece.ucsb.edu/sites/default/files/publications/1195_Sysak_JSTQ_2011J.pdf.
Kuldeep Amarnath, "Active Microring and Microdisk Optical Resonators on Indium Phosphide," Dissertation, 2006, pp. 1-163, Available at: <drum.lib.umd.edu/bitstream/1903/3513/1/umi-umd-3343.pdf>.
International Search Report and Written Opinion received for PCT Patent Application No. PCT/US2011/058756, dated Aug. 27, 2012, 6 pages.
International Search Report and Written Opinion received for PCT Patent Application No. PCT/US2011/050083, dated May 1, 2012, 7 pages.
International Search Report and Written Opinion received for PCT Application No. PCT/US2016/013605, dated Oct. 13, 2016, 10 pages.
International Preliminary Report on Patentability received for PCT Patent Application No. PCT/US20111058756, dated May 15, 2014, 5 pages.
International Preliminary Report on Patentability received for PCT Patent Application No. PCT/US20111050083, dated Mar. 13, 2014, 6 pages.
International Preliminary Report on Patentability received for PCT Application No. PCT/US2016/013605, dated Jul. 26, 2018, 9 pages.
G. Morthier et al., "Microdisk Lasers Heterogeneously Integrated on Silicon for Low-Power, High-Speed Optical Switching," Photonics Society Newsletter, Jun. 2010, vol. 24, Issue 3, pp. 5-10, IEEE, Available at: <lecture.ecc.u-tokyo.ac.jp/.about/tlecwada/Optics%20&%20Photonics/pres- entation%20files/paper9.pdf>.
European Search Report and Search Opinion Received for EP Application No. 11875113.0, dated Jul. 30, 2015, 3 pages.
European Search Report and Search Opinion Received for EP Application No. 11871524.2, dated Jul. 16, 2015, 8 pages.
Delphine Marris-Morini et al., "D006—State of the art on Photonics on CMOS," Nov. 30, 2009, pp. 1-70, Available at: <helios-project.eu/content/download/326/2147/file/HELIOS.sub.—D006.pd- f>.
Ansheng Liu et al, "A High-Speed Silicon Optical Modulator Based on a Metal-Oxide-Semiconductor Capacitor," Nature-427, Feb. 12, 2004, Nature Publishing Group, pp. 615-618.
A. Liu et al., Optics Express, Jan. 22, 2007, vol. 15, No. 2, pp. 660-668.
Impact of Interfacial Layer and Transition Region on Gate Current Performance for High-K Gate Dielectric Stack: Its Trade off With Gate Capacitance, (Research Paper), Electron Devices, IEEE Transacfons on 50.2, Mar. 2003, pp. 433-439.
Zhiping Zhou et al. "On-chip light sources for silicon photonics" Light: Science & Applications, www.natrure.com/lsa Aug. 5, 2015, pp. 1-13.
Yu Xia, "Tetracene air-gap single-crystal field-effect transistors." Applied Physics Letters 90, 162106, 2007, 3 pages, <http://rogers.matse.illinois.edu/files/2007/tetraceneapl.pdf>.
Youngho Jung et al. "Hybrid integration of III-V semiconductor lasers on silicon waveguides using optofluidic microbubble manipulation" Scientific Reports www.nature.com/scientificreports, published Jul. 19, 2016, pp. 1-7.
Xianshu Luo et al. "High-throughput multiple dies-to-wafer bonding technology and III/V-on-Si hybrid laser for heterogeneous integration of optoelectronic integrated circuits" www.Frontiersin.org published Apr. 7, 2015, pp. 1-22.

Partial Supplementary European Search Report received in EP Application No. 12875835.6, Oct. 11, 2015, 6 pages.
Masahiro Yanagisawa et al. "Film-Level hybrid integration of AlGaAs laser diode with glass waveguide on Si substrate" IEEEPhotonics Technology Letters, vol. 4, No. 1, Jan. 1992, pp. 21-23.
Liu, A. et al., "A High-Speed Silicon Optical Modulator Based on a Metal-Oxide-Semiconductor Capacitor," Nature 427, Feb. 12, 2004, Nature Publishing Group, pp. 615-618.
Liang, D., "III-V-on-Silicon Hybrid Integration, Materials, Devices, and Applications," IEEE Winter Topicals, 2011, pp. 151-152.
Liang, D. et al., "Optimization of Hybrid Silicon Microring Lasers," Photonics Journal, IEEE 3.3, 2011, pp. 580-587.
Liang et al, "Highly efficient vertical outgassing channels for low-temperature InP-to-silicon direct wafer bonding on the silicon-on-insulator substrate"; 2008; pp. 1560-1568.
Li, J., "Wafer Scale Flexible Interconnect Fabrication for Heierogeneous Integration," (Doctoral Dissertation), TU Delft, Deifl University of Technology, Oct. 26, 2015, 94 pages.
Kissinger et al., "Void-free silicon-wafer-bond strengthening in the 200-400 °C range", Sens. Actuators. A 36, 1993, pp. 149-156.
Jeong, Y-K et al.; "High Quality High-k MIM Capacitor by Ta2O5/HfO2/Ta2O5 Multi-layered Dielectric and NH3 Plasma Interface Treatments for Mixed-Signal/RF Applications,"; Jun. 15-17, 2004: pp. 222-223.
International Search Report and Written Opinion received for PCT Patent Application No. PCT/US2015/048365, dated May 30, 2016, 11 pages.
International Search Report and Written Opinion received for PCT Patent Application No. PCT/US2014/048833, dated Apr. 29, 2015, 9 pages.
International Search Report and Written Opinion received for PCT Patent Application No. PCT/US2014/048818, dated Apr. 22, 2015, 11 pages.
International Search Report and Written Opinion received for PCT Patent Application No. PCT/US2012/035893, dated Dec. 26, 2012, 8 pages.
International Search Report and Written Opinion received for PCT Patent Application No. PCT/US16/24823, dated Dec. 26, 2016, 10 pages.
International Preliminary Report on Patentability received for PCT Patent Application No. PCT/US2015/048365, dated Mar. 15, 2018, 10 pages.
International Preliminary Report on Patentability received for PCT Patent Application No. PCT/US2014/048833, dated Feb. 9, 2017, 7 pages.
International Preliminary Report on Patentability received for PCT Patent Application No. PCT/US2014/048818, dated Feb. 9, 2017, 10 pages.
International Preliminary Report on Patentability received for PCT Patent Application No. PCT/US16/24823, dated Oct. 11, 2018, 9 pages.
International Preliminary Report on Patentability received for PCT Application No. PCT/US2012/035893, dated Nov. 13, 2014, 7 pages.
Hirakawa. K. et al., High Resolution Subpixel and Subframe Rendering for Color Flatpanel and Projector Displays, 2011 18th IEEE International Conference, Sep. 11-14, 2011, pp. 1725-1728.
Heck, M. J. R., et al.; "Hybird Silicon Photonics for Optical Interconnects"; Aug. 13, 2010; pp. 1-14.
Haataja, M. et al.; "Dislocations and Morphological Instabilities: Continuum Modeling of Misfitting Heteroepitaxial Films"; Apr. 5, 2002; 20 pages.
Google search (hybrid laser, waveguide, substrate) pp. 1-2.
Fang, Alexander W. et al., Electrically Pumped Hybrid Alganias-silicon Evanescent Laser, Optics Express, Oct. 2, 2006, vol. 14, No. 20, pp. 9203-9210.
Fan, Y-Y., et al; "Impact of Interfacial Layer and Transition Region on Gate Current Performance for High-K Gate Dielectric Stack: Its Tradeoff With Gate Capacitance,"; Feb. 2003; pp. 433-439.
Extended European Search Report received in EP Application No. 12875835.6, Feb. 18, 2016, 15 pages.
Chen, X., et al.; "Active Transmission Control Based on Photonic-Crystal MOS Capacitor"; Jan. 23, 2007; pp. 1-9.

(56) References Cited

OTHER PUBLICATIONS

Caglar Duman et! al. "Comparative modeling results for ridge waveguide MOW and hybrid Si/III-V lasers" Journal of radiation research and applied sciences, Nov. 17, 2017, pp. 1-5.
Basak, J. et al., Developments in Gigascale Silicon Optical Modulators Using Free Carrier Dispersion Mechanisms, Apr. 15, 2008, Advances in Optical Technologies, vol. 2008, 10 pages.
Alexander W. Fang "Electrically pumped hybrid AlGaInAs-silicon evanescent laser" Optical Society of America, Oct. 2, 2016/ vol. 14, No. 20/Optics Express, pp. 9203-9210.

* cited by examiner

DEVICE INCLUDING STRUCTURE OVER AIRGAP

BACKGROUND

Heteroepitaxy, also referred to as monolithic integration, is a powerful technique to integrate different materials on a same substrate for special functionalities or enhanced device performance. Heteroepitaxy is often used to grow crystalline films of materials for which crystals cannot otherwise be easily obtained and to fabricate integrated crystalline layers of different materials. Heteroepitaxy can be used to grow device materials in electronic and photonic devices.

BRIEF DESCRIPTION OF THE DRAWINGS

Certain examples are described in the following detailed description and in reference to the drawings, in which.

DETAILED DESCRIPTION OF SPECIFIC EXAMPLES

Heteroepitaxy is useful technique for the manufacture of various devices used in photonic and electronic computing applications. However, material property incompatibilities like differing lattice constants or thermal expansion coefficients (CTE) can result in defects in heteroepitaxially grown materials. Those defects may have a detrimental effect on microelectronic and photonic devices. These challenges contribute to the difficulty of manufacturing high-performance, reliable devices using direct bandgap compound semiconductors heteroepitaxially grown on silicon.

As a result, effort has been spent into developing ways to minimize defect formation and propagation. The use of intermediate layers, lateral overgrowth methods, and quantum dot active regions have been proposed. However, these solutions do not adequately eliminate defect formation at the heteroepitaxial interface, and they do not produce devices with adequate reliability. Another solution involves limiting functional layers to be within a critical thickness, under which defect formation is mostly mitigated. However, many functional layer thicknesses are above corresponding critical thickness. Wafer bonding is a technique often used to join device layers. Wafer bonding, however, may result in extra fabrication cost and size mismatches with substrates can impact overall device yield.

Implementations of the described technology provide a platform for heteroepitaxially grown devices. The platform includes an airgap created under a structure. For example, a region of a buried oxide (BOX) layer may be removed from a silicon-on-insulator (SOI) substrate to create the airgap, the structure etched into the upper silicon layer of the SOI substrate. A dielectric layer may be used to provide an interface for wafer bonding a thin layer of a second solid-state material, which then serves a as a base layer for epitaxial growth for further solid-state materials. Additionally, the dielectric and solid-state material layers may be used to form a capacitor.

Figure 1:
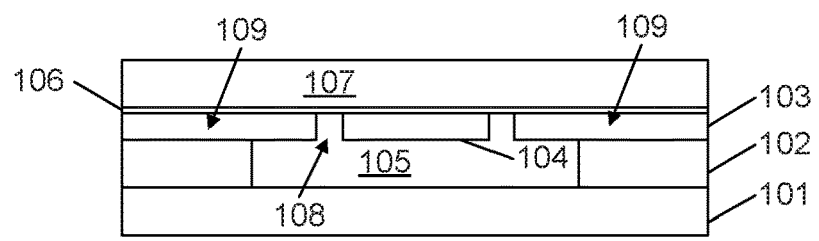
FIG. 1 illustrates an example device.

FIG. 1 illustrates an example device. The device includes a substrate 101. Substrate 101 may be a wafer or solid substance onto which other substances are adhered. Substrate 101 may serve as a foundation for microelectromechanical (MEM) and photonic devices, and may be the base that electronic and photonic devices are deposited. Substrate 101 may, in some examples, be a thin slice of material, which may include semiconductors such as silicon and germanium, compound semiconductors such as gallium arsenide (GaAs) and indium phosphide (InP), or dielectric insulators such as silicon oxide and aluminum oxide. In some examples, substrate 101 may include multiple materials, including but not limited to the examples listed above. Furthermore, in some examples, substrate 101 may include multiple layers, with each layer having a different material. In an example implementation, the substrate 101 is the base layer of an SOI substrate.

The device includes a sacrificial material layer 102 over the substrate. For example, the sacrificial material layer 102 may be composed of an insulating material such as silicon dioxide ($SiO_2$), aluminum oxide ($Al_2O_3$), silicon nitride ($SiN_x$) or other insulators. For example, sacrificial material layer 102 may be a buried oxide (BOX) layer of an SOI substrate. As another example, the sacrificial material layer 102 can be another material that can be selectively removed to create an airgap. For example, the sacrificial material layer 102 may comprise the aluminum arsenide (AlAs) layer of a GaAs/AlAs/GaAs substrate. In this case, AlAs may be selectively removed using HF, which etches AlAs faster than GaAs.

The layer 102 includes an airgap 105. The airgap 105 may be formed via selective removal of a portion of the sacrificial material of the layer 102. In the illustrated example, the airgap 105 has a height extending through the entire sacrificial material layer 102. In other words, all of the sacrificial material within the layer 102 is removed within the airgap 105, and the bottom of the airgap 105 coincides with the top of the substrate layer 101. In other implementations, the airgap 105 may extend partially through the sacrificial layer 102. For example, there may be some portion of sacrificial material above the airgap 105, some portion of sacrificial material below the airgap 105, or both.

The device further includes a first solid-state material layer 103 over the sacrificial material layer 102. In some implementations, the first solid-state material layer 103 may be composed of a semiconductor material, such as a direct or indirect bandgap semiconductor. For example, the layer 103 may be composed of Si or Ge or compounds such as GaAs, InP, AlGaAs, AlAs, SiC, SiGe, SiGeC, InAs, or other III-V or II-VI compound semiconductors. The layer 103 may be an upper Si layer of a SOI substrate or an upper SiGe layer of a silicon germanium-on-insulator (SGOI) substrate. In various implementations, the layer 103 may be a lightly or heavily n- or p-type doped semiconductor. In other implementations, the layer 103 is undoped.

The first solid-state material layer 103 further comprises a structure 104 separated from a bulk portion 109 of the layer 103 by trenches 108. For example, the structure 104 may comprise a waveguide, a grating, a photonic crystal, a reflector, or other passive or active photonic device. In the illustrate example, the structure 104 is etched entirely from the layer 103. In other examples, the structure may include additional components, such as modulators, metallizations, active photonic or electronic components, or additional layers/structures composed of other materials.

The structure 104 is disposed over the airgap 105. In other words, the bottom surface of the structure 104 forms at least a portion of the top of the airgap 105. Trenches 108 extend through the layer 103 into the airgap 105. For example, the trenches 108 may be used as windows during a selective underlayer etching process used to remove the layer 102 during a manufacturing process. For example, the trenches 108 may allow access by a chemical etchant, such as HF, to the layer 102. Additionally, the trenches 108 separate the structure 104 from the bulk portion 109 of the layer 103. This may isolate the structure 104 from strain caused by thermal expansion coefficient differences between the layer 103 and higher layers (such as layer 107, described below).

The device further comprises a dielectric layer 106 over the solid-state material layer 103. In some implementations, the dielectric layer 106 may composed of silicon dioxide, a high-k dielectric (i.e., a dielectric having a higher dielectric constant than silicon dioxide, or a low-k dielectric (i.e., a dielectric having a lower dielectric constant than silicon dioxide). For example, the dielectric layer 106 may be composed of various materials such as oxides of hafnium, zirconium, titanium, aluminum, silicon, and the like, as well as silicates, aluminates, titanates, nitrides, and combinations, including multilayered arrangements. Additionally, polymer materials can be used for the dielectric layer 106, such as polymethylstyrene, polypropylene oxide, and polymethylmethacrylate. The materials can also include copolymerisations of two or more polymers together for tailored dielectric properties, such as using a copolymer of polyimide with polysiloxane. Polyimide-ceramic composites can be used, such as alumina (Al2O3), barium titanate (BaTiO3), titania (TiO2), or zirconia (ZrO2) incorporated into a polymer matrix. The dielectric layer 106 can include two or more layers of dissimilar dielectric materials.

A desired thicknesses for the dielectric layer 106 can depend on a type of the layer material, such whether the material is a high-k or low-k dielectric, and the target application of the device, such as capacitor or optical waveguide. For example, when a dielectric material is used to achieve a high capacitance, a thinner layer can be desirable (e.g., on the order of several nanometers), but not so thin to result in undesirably large capacitor leakage current. In some example implementations, a layer can have a thickness of on the order of 0.5 nanometer (nm)-50 nm, or beyond (from sub-nanometer thicknesses to hundreds of nanometers in thickness). The thickness of a given layer can be used to offset or complement material characteristics of the material used to form that layer. For example, when using a high-k material, a relatively large layer thickness can be used to achieve a similar capacitance effect as though a low-k dielectric were used (at a comparably thinner layer thickness). Increased layer thickness can be used to avoid high leakage current, or compensate for other material properties. Very thin layers can also be used to achieve various properties, by reducing layer thicknesses and/or by combining a plurality of thin layers together.

The device further comprises a second solid-state material layer 107 over the dielectric layer 107. In some implementations, the second solid-state material layer 107 may be composed of the same or a different material as layer 103. For example, the layer 107 may comprise Si or Ge or compounds such as GaAs, InP, AlGaAs, AlAs, SiC, SiGe, SiGeC, InAs, or other III-V or II-VI compound semiconductors. In some implementations, the second layer 107 may include a lower layer that is wafer bonded to the assembly including layers 103-101 and an upper portion that is epitaxially grown on the lower layer. In some such cases, the upper portion may be a different material than the lower layer and grown using a heteroepitaxial growth process. In various implementations, the layer 107 may be a lightly or heavily n- or p-type doped semiconductor. In other implementations, the layer 107 is undoped.

Figure 2A:
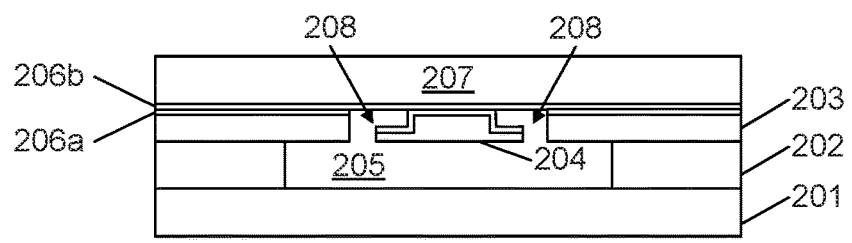
FIGS. 2A and 2B illustrate an example device including multiple dielectric layers and interface layers between the first solid-state material layer and the second solid-state material layer.
Figure 2B:
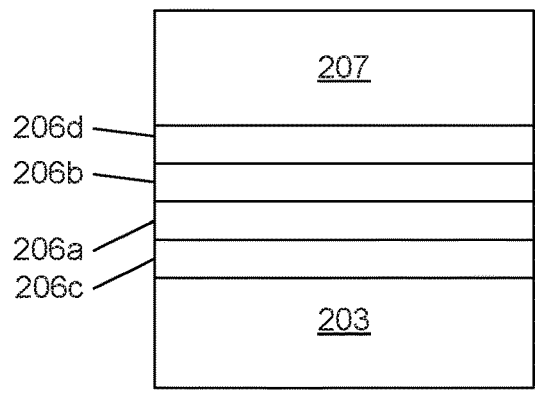

FIGS. 2A and 2B illustrate an example device including multiple dielectric layers and interface layers between the first solid-state material layer and the second solid-state material layer.

The device includes a substrate 201, a sacrificial material layer 202 including an airgap 205, a first solid-state material layer 203 including trenches 208 and a structure 204, and a second solid-state material layer 207. These elements may be as described herein with respect to the substrate 101, the sacrificial material layer 102 including the airgap 105, the first solid-state material layer 103 including trenches 108 and the structure 104, and the second solid-state material layer 107, respectively. In this example, the structure 204 comprises a rib waveguide. However, in other examples, the structure 204 may be any other structure as described herein.

The device further includes a first dielectric layer 206a and a second dielectric layer 206b on the first dielectric layer 206a. For example, during manufacture, the first dielectric layer 206a may be disposed over the first layer 203 and the second dielectric layer 206b may be disposed over the second layer 207. During manufacture, the second layer 207 may be flipped and the second dielectric layer 206b may be bonded to the first dielectric layer 206a. The first 206a and second dielectric layers 206b may be composed of the same or different dielectric materials. For example, the dielectric material may be of the type described with respect to dielectric 106.

FIG. 2B illustrates a close-up view of the junction between the first and second solid state material layers 203, 207. The illustrated example includes a first interface layer 206c between the first dielectric layer 206a and the first solid-state material layer 203. For example, an interface layer 206c may be used to provide enhancement between the dielectric 206a and other layers, based on providing low interface state density while increasing surface smoothness and bonding surface energy for the dielectric layer 206a.

Layer 206c can include at least one first interface layer, at least one second interface layer, and so on, between the dielectric layer 206a and the first solid state material layer 203. A number of such interface layers 206c can be unequally distributed below the dielectric layer 206a. For example, an interface layer 206c can be provided as a layer of dielectric, to prepare a very smooth surface. Such interface layers 206c can be chosen for providing a given desired characteristic (e.g., providing mechanical smoothing, dangling-bond passivation) without a need to satisfy an electrical characteristic. Subsequently, the dielectric layer 206a can be deposited on the interface layer 206c to provide the desirable electrical characteristic (such as high-k) and/or optical characteristics (such as low optical loss) while enjoying the improved mechanical bonding effect provided by the interface layer 206c. Furthermore, the cumulative effect of the multiple layers can be synergistic. For example, because the interface layer 206c can provide a very smooth surface, the dielectric layers 206a deposited on the interface layer 206c also assume a smooth configuration, thereby enabling the dielectric layers 206a, 206b themselves to providing improved bonding performance at layer-layer interfaces in the device that may not be in contact with the interface layer 206c. Similarly, interface layer 206d can provide enhancement between the dielectric 206b and the other layers. The interface layer 206d may the same or a dissimilar composition and structure to the interface layer 206c.

The interface layers 206c, 206d thereby provide great flexibility in the combination of possible material choices for other layers, such as the first and/or second solid-state layers 203, 207, and the dielectric layers 206a, 206b. For example, some materials used for dielectric layers 206a 206b, when deposited directly onto a semiconductor first/second layer 203, 207, can react with the semiconductor to produce gases byproducts and/or native oxides at the interface, which would result in rough deposition and corresponding poor bond if that material were used alone. The use of interface layers 206c 206d can prevent such poor results, e.g., by acting as a seed layer to enable the use of difficult materials for their desired characteristics, while enabling uniform consistent and smooth deposition of the difficult material. The interface layers 206c 206d can also passivate surface dangling bonds of the layers on which the interface layer is deposited (e.g., first and second layers 203 207), thereby protecting such layers from negative interactions (e.g., forming native oxide in atmosphere) and providing high interface quality and easy bonding. Additionally, the interface layer 206c 206d can serve as a seed layer to enable uniform deposition of the dielectric layer 206a 206b onto its corresponding interface layer 206c 206d. Additionally, the interface layer 206c 206d may provide dangling-bond passivation for its corresponding solid-state material layer 203 207.

Different combinations of dielectric materials/layers enable the use of materials that may otherwise result in poor bonding and/or performance, which would otherwise prevent the use of such materials in a given application (e.g., photonics). The versatile dielectric stacks enable broad options to optimize aspects such as interfaces between dissimilar materials, smooth bonding surfaces, use of high-k dielectric materials, and the like. The interface between dielectrics and semiconductor materials can benefit from high quality dielectric and low interface defects, and low interface state density, due to the use of interface layer(s). Similarly, smooth bonding surfaces of two dielectric layers (or dielectric and semiconductor layers), e.g., between two sub-layers within the dielectric layer(s), enables high bonding surface energy at a moderate post-bonding annealing temperature. Interface state density, including achieving a relatively low interface state density, can vary from one type of interface to another. Thus, as used herein, the concept of low interface state density corresponds to a given bond, and achieving a relatively lower interface state density for the given bond (e.g., by virtue of use of the interface layer(s) 140, as compared to achieving the bond without the interface layer(s)). As an example, for a Si/SiO2 interface, $\sim 10^{10}$ cm$^{-2}$*eV$^{-1}$ can be considered to be relatively low interface state density. In contrast, for an InP/oxide interface, a relatively low interface state density can be one or two orders of magnitude higher than that of a Si/SiO$_2$ interface. Thus, low interface state density can beneficially impact applications such as in MOS capacitor performance. For MOS-capacitor applications, the interface layer(s) enable the use of high-k dielectrics including (but not limited to) HfO2, ZrO2, TiO2, and Al2O3, which are desirable to obtain high capacitance but may not be ideal for bonding characteristics (absent the interface layer(s)).

Thus, first/second layers can be provided as doped heterogeneous or homogeneous semiconductor materials, having dielectric layer(s) sandwiched in between. The dielectric layer(s) and/or the interface layer(s) can serve as a bonding interface, and can also function as e.g., an insulation layer of a MOS capacitor. Dielectrics with high dielectric constant k or low dielectric constant k can be introduced, while achieving low void density by virtue of the interface layer(s) or appropriate layer of dielectric layer(s) (e.g., if a dielectric layer is directly bonded to the first and/or second solid-state layer). The use of dielectric schemes can provide heterogeneous integration by bonding technology to optimize the semiconductor/dielectric interfaces, separate from the optimization of bonding surfaces, providing multiple techniques of optimizing a given device.

Figure 3:
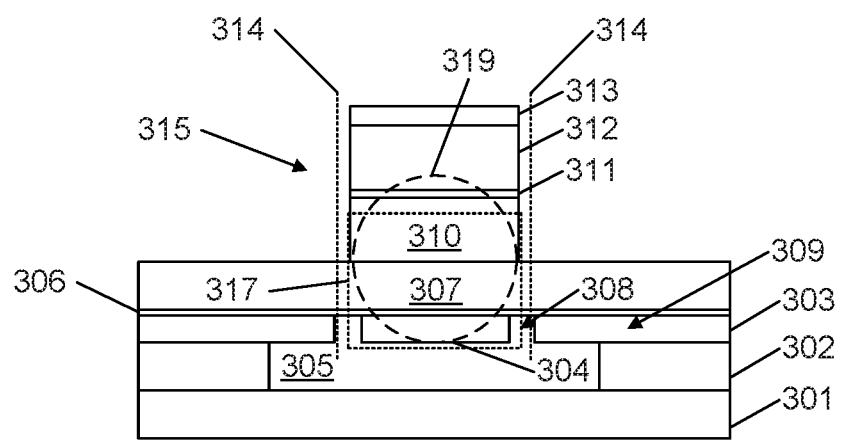
FIG. 3 illustrates a device include a mesa over the second solid-state material layer.

FIG. 3 illustrates a device include a mesa 315 over the second solid-state material layer 307. The device includes a substrate 301, a sacrificial material layer 302 including an airgap 305, a first solid-state material layer 303 including trenches 308 and a structure 304, and a second solid-state material layer 307. These elements may be as described herein with respect to the substrate 101, the sacrificial material layer 102 including the airgap 105, the first solid-state material layer 103 including trenches 108 and the structure 104, and the second solid-state material layer 107, respectively. Additionally, although illustrated with a single dielectric layer 106, the device may include multiple dielectric layers and may also include interface layers as described with respect to FIG. 2.

The device further includes a mesa structure 315. The mesa structure 315 is disposed over the airgap 305. For example, the mesa structure 315 may disposed within vertical boundaries 314 extending through the trenches 308. In other examples, the airgap 305 may extend into the sides of the sacrificial layer 302 beyond the outer sidewalls of the trenches 308. In such examples, the mesa structure may be within the vertical boundaries extending through the outer sidewalls for the airgap 305 (i.e., the mesa may overlap the part of the bulk portion 309 of the first layer 303 that overlaps the airgap 305).

The presence of the airgap 305 may mitigate the formation and propagation of defects in the vertical region defined by the sidewalls of the trenches (i.e., the region between boundaries 314) or in the vertical region defined by the sidewalls of the airgap 305. For example, airgap 305 may allow the freestanding portions 309 of the first layer 304 to elastically deform to accommodate for stress generated by mismatch between first semiconductor layer 303 and second semiconductor layer 307. By concentrating the stress on first semiconductor layer 303, the freestanding portions of second semiconductor layer 307 may be less prone to defect formation and propagation. Furthermore in some examples, the thickness of first semiconductor layer 303 may be below a critical thickness, under which defect formation is largely reduced. As a result, defect formation within freestanding region of the second layer 307 may also be mitigated. As the structure 315 is over the freestanding region of the second layer 307, defect formation within the structure 315 may also be avoided.

The structure 315 may comprise one or more material layers 310-313. The illustrated example includes a first layer 310 on the second solid-state material layer 307. In this example, the second solid-state material layer has a first crystal structure and mesa comprises a solid-state material having a second crystal structure with a matching lattice with the first crystal structure. Two materials may have matching lattices when they are in the same material system allowing the second material to be heteroepitaxially grown on the first material with low enough defect rates to satisfy device operability constraints. For example, AlGaAs has a matching lattice with GaAs, InGaAsP on In and can be grown on these substrates with sufficiently low defect rates. For example, the layer 310 may comprise the same solid-state material as the second solid-state material layer 307 where the first crystal structure is the same as the first crystal structure.

In some implementations, the mesa 315 may comprise an active photonic device. For example, the mesa may comprise a laser. For example, the first layer 310 may be a doped semiconductor material, and the mesa may include a second doped semiconductor layer 312 and a laser gain material layer 311. For example, the layers 310-312 may form a III-V semiconductor laser. In other examples, the mesa 315 may comprise other photonic devices, such as diodes, saturable absorbers, photonic amplifiers, or quantum dot lasers.

In the illustrated example, the lower layer 310 of the mesa 315 also serves as an upper layer of a capacitor 317. The capacitor 371 includes at least a portion of the layer 310, the layer 307, the dielectric layer(s) 306 and the structure 304. Accordingly, the structure 304 may serve as a waveguide to transport generated light as well as a portion of the capacitor used to tune the light. For example, the capacitor 317 may be a metal-oxide semiconductor (MOS) capacitor that can be used to tune optical refractive index and optical loss, based on the use of high-k dielectrics to enhance the tuning range. It is also possible to reduce some of the tuning capability of the capacitor, by using a low-k dielectric, because the low-k dielectric provides benefits of lower optical loss for the light wavelengths used. Accordingly, the dielectric layer(s) 306 can provide the dielectric characteristics compatible with optical modes 319 that are to at least partially overlap the device. The optical modes 319 are associated with wavelengths on the order of approximately 10 nanometers to 1 millimeters, and a scheme of dielectric layer(s) and interface layer(s) is based on a given wavelength for the device and achieving low optical loss in view of the given wavelength. Further, the formed capacitor 307 of layers 310, 307, 306, 304 can be used to tune the optical refractive index and optical loss, where high-k dielectrics can be preferred. Laser optical mode(s) 319 are generated via an applied voltage across the laser layers 313-310 ($V_{LASER}$), and carrier distribution changes are caused by an applied voltage across layer 310, 304 ($V_{MOS}$), providing laser resonant wavelength tuning as well as loss tuning.

Figure 4:
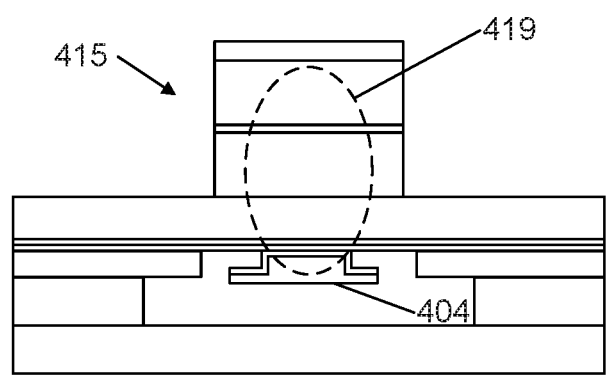
FIG. 4 illustrates an example device including a rib waveguide.

FIG. 4 illustrates an example device including a rib waveguide 404. In FIG. 3, a rectangular waveguide 304 allows optical modes confined by the width of the mesa 315. In FIG. 4, a rib waveguide 404 permits optical modes 419 confined to the upper portion of the rib waveguide 404. Accordingly, FIG. 4 may allow wider message 415 without impact to permitted optical modes.

Figures 5A, 5B:
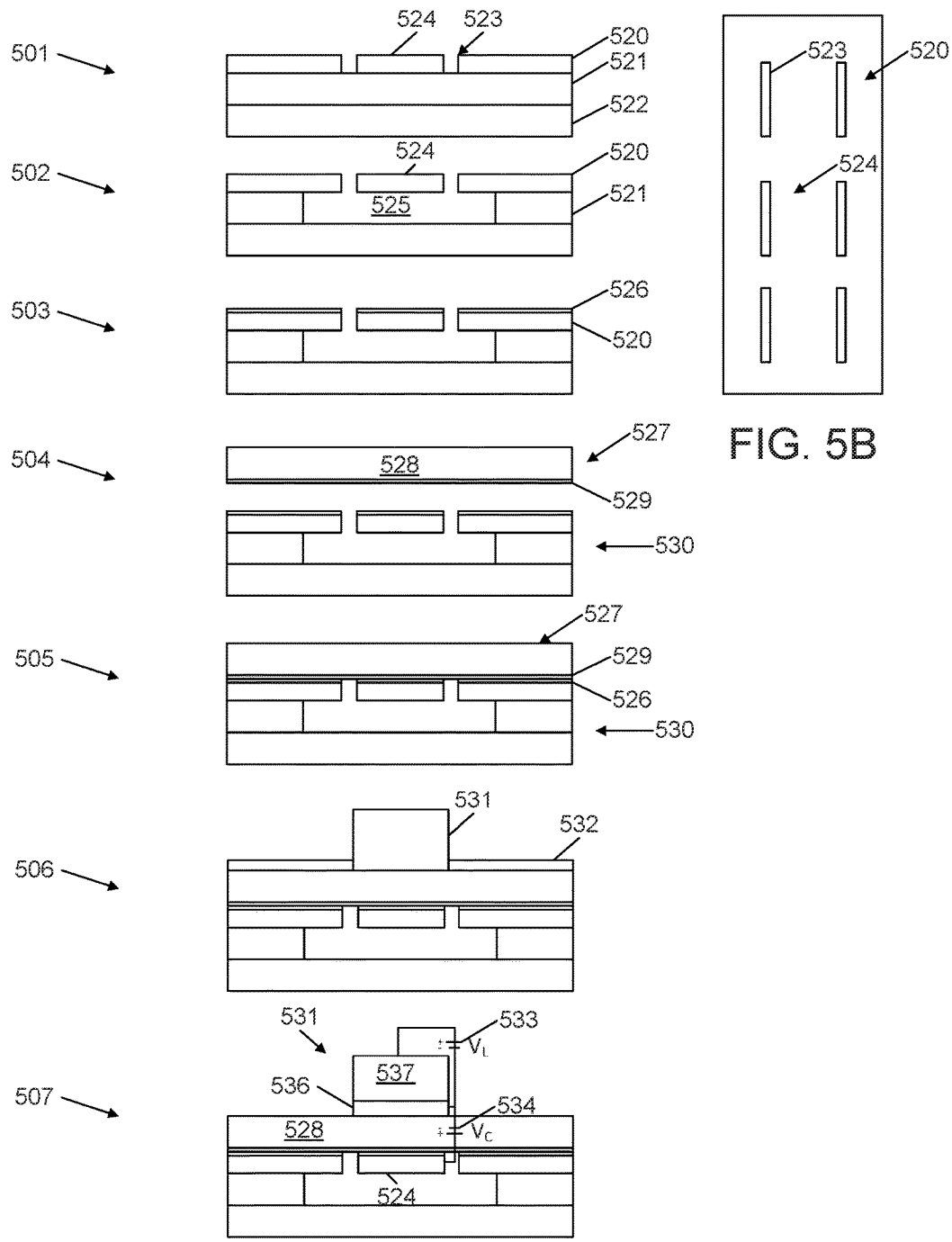
FIG. 5A illustrates an example fabrication process flow.
FIG. 5B illustrates a top-down view of the assembly after a step of the flow.

FIG. 5A illustrates an example fabrication process flow. FIG. 5B illustrates a top-down view of the assembly after step 501 of the flow. The various layers can be produced by plasma-enhanced chemical vapor deposition (PECVD), atomic layer deposition (ALD), sputter deposition, thermal oxidation, ozone oxidation, wet chemical oxidation, native oxide, spin coating, or a combination of one or more approaches.

The example process begins with step 501. Step 501 comprises forming trenches 523 extending to a sacrificial material layer 521 in a first solid-state material layer 520 such that the trenches 523 define a structure 524 separated from a bulk portion of the first material layer 520. For example, step 501 may comprise lithographically defining and chemically etching the trenches. In the illustrated example the trenches 523 extend through the first layer 521 and stop at the sacrificial layer 521. However, in other implementations, the trenches 523 may extend through or partially through the sacrificial layer 521 to introduce the etchant used to form the air gap 524 to the proper depth.

For example, the trenches may be formed using an isotropic wet etch, for example, using hydrofluoric acid (HF). As another example, the layer 520 can be anisotropically etched with one or more plasma gases, such as carbon tetrafloride ($CF_4$) containing fluorine ions, in a commercially available etcher, such as a parallel plate DRIE apparatus or, alternatively, an electron cyclotron resonance (ECR) plasma reactor to replicate the mask pattern of the trenches in the layer 520. In the illustrated example, the structure 524 will be a rectangular waveguide, and the trenches 523 are rectangular prisms. In other examples, step 501 may include etching further features of the structure 524. For example, step 501 may include etching other waveguide features, such as etching the outer portions of a ribbon waveguide. As another example, step 501 may include etching troughs to define the ridges of a grating, or holes for a photonic crystal.

The example process continues to step 502. Step 502 comprises using the trenches 523 to selectively remove a portion of the sacrificial material layer 521 to form an airgap 525 underneath the structure 524. For example, step 502 may comprise introducing a selective wet etchant to access the layer 521 through the trenches 523 and isotopically etch the airgap. As an example, a wet etch using HF may be employed to remove the airgap.

The example process continues to step 503. Step 503 comprises disposing a dielectric layer 526 over the first solid-state material layer 520. For example, step 503 may comprise depositing the dielectric layer 526 on the first solid-state material layer 520. In an implementation utilizing interface layers, step 503 may comprise depositing one or more interface layers on the layer 520 and then depositing the dielectric layer 526 on the uppermost interface layer.

The example process continues to step 504. In step 504 a wafer 527 comprising a second solid-state material layer is obtained. Step 504 may also comprise depositing a second dielectric layer 529 on the wafer 527, and flipping the wafer so that the second dielectric layer 529 faces the first dielectric layer 526.

The example process continues to step 505. In step 505, the wafer 527 is bonded to the assembly 530 comprising the sacrificial material layer 521 and the first solid-state material layer 520. For example, step 505 may comprise bonding the external dielectric layer 529 of wafer 527 to the external dielectric layer 526 of the assembly 530. Additionally, step 505 may comprise various pre-bonding treatments to enhance the bonding step. For example, step 505 may include treatment by pre-deposition cleaning, e.g., Radio Corporation of America (RCA) cleaning, native oxide removal, dangling bond passivation by wet chemicals, or by plasma cleaning. The layers can be improved by application of post-deposition thermal annealing to produce dense dielectrics, post-deposition plasma treatment to suppress interfacial void formation, or post-bonding annealing to generate large bonding surface energy.

The example process continues to steps 506 and 507 to create a laser tuned by a MOS capacitor. However, the platform produced by step 505 may be utilized in various photonic or MEMs systems.

Step 506 comprises forming a mesa 531 on the upper surface of the wafer 527. For example, step 506 may comprise patterning a portion of the surface of assembly with a dielectric mask 532 and growing the mesa 531 on the unmasked portions of the assembly. As described above, the mesa may comprised the same or different material as the second solid-state material 528. Portions of the mesa that will be epitaxially grown on the material 528 may have the same or a compatible crystal lattice structure as the material 528.

Step 507 comprises coupling a voltage source 534 to a capacitor formed from a portion of the mesa and the structure. For example, the capacitor may be formed from a lower layer 536 of the mesa 531, the second solid-state material layer 528, the dielectric layers 529, 526, and the structure 524. Step 507 may further comprising coupling a voltage source 533 to a second part of the mesa 531 to power a second active photonic device. For example, step 507 may comprise coupling a second voltage source 533 to power a III-V material laser formed in an upper region 537 of the mesa 531.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

The invention claimed is:

1. A device, comprising:
 a substrate;
 a sacrificial material layer over the substrate, the sacrificial material layer having an airgap;
 a first solid-state material layer over the sacrificial layer, the solid-state material layer comprising a structure over the airgap and separated from a bulk portion of the first material layer by trenches, the trenches extending to the airgap;
 a dielectric layer over solid-state material layer;
 a second solid-state material layer over the dielectric layer.

2. The device of claim 1, wherein the airgap extends below a portion of the bulk portion of the first solid-state material layer.

3. The device of claim 1, wherein the structure is a passive photonic device.

4. The device of claim 3, wherein the structure is a waveguide.

5. The device of claim 4, wherein the structure is a rib waveguide.

6. The device of claim 1, wherein the structure, the dielectric, and second solid-state material layer form a capacitor.

7. The device of claim 1, further comprising a mesa over the second solid-state material layer.

8. The device of claim 7, wherein the second solid-state material layer has a first crystal structure and mesa comprises a solid-state material having a second crystal structure with a matching lattice with the first crystal structure.

9. The device of claim 8, wherein the mesa comprises the same solid-state material as the second solid-state material layer and the first crystal structure is the same as the second crystal structure.

10. The device of claim 1, further comprising an active photonic device over the second solid-state material layer and the airgap.

11. The device of claim 10, wherein the active photonic device is within a vertical boundary defined by the trenches.

12. The device of claim 1, further comprising a second dielectric layer over the first dielectric layer.

13. The device of claim 1, wherein the first material layer comprises an oxide, the first solid-state material layer comprises silicon, and the second solid-state material layer comprises a III-V material.

14. The device of claim 1, wherein the airgap extends through the entire sacrificial material layer.

15. A method, comprising:
 forming trenches extending to a sacrificial material layer in a first solid-state material layer such that the trenches define a structure separated from a bulk portion of the first material layer;
 using the trenches to selectively remove a portion of the sacrificial material layer to form an airgap underneath the structure;
 disposing a dielectric layer over the first solid-state material layer; and
 bonding a wafer comprising a second solid-state material layer to an assembly comprising the sacrificial material layer and the first solid-state material layer.

16. The method of claim 15, further comprising:
 forming a mesa on the second solid-state material layer over the airgap.

17. The method of claim 16, wherein the mesa comprises the same material as the second solid-state material layer.

18. The method of claim 16, further comprising coupling a voltage source to a capacitor formed from a portion of the mesa and the structure.

19. The method of claim 15, wherein disposing the dielectric layer over the first solid-state material layer comprises depositing a first dielectric layer over the first solid-state material layer.

20. The method of claim 19, further comprising depositing a second dielectric layer on the wafer, and wherein bonding the wafer comprises bonding the second dielectric layer to the first dielectric layer.

* * * * *